(12) United States Patent
Feldtkeller

(10) Patent No.: US 9,019,005 B2
(45) Date of Patent: Apr. 28, 2015

(54) VOLTAGE REGULATING CIRCUIT

(75) Inventor: Martin Feldtkeller, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/535,399

(22) Filed: Jun. 28, 2012

(65) Prior Publication Data

US 2014/0002185 A1    Jan. 2, 2014

(51) Int. Cl.
  *G05F 1/10* (2006.01)
  *G05F 1/595* (2006.01)
  *G05F 1/46* (2006.01)

(52) U.S. Cl.
  CPC . *G05F 1/595* (2013.01); *G05F 1/46* (2013.01)
  USPC .......................................... 327/543; 327/540

(58) Field of Classification Search
  USPC .......................................................... 327/543
  See application file for complete search history.

(56) References Cited

U.S. PATENT DOCUMENTS

| | | | | |
|---|---|---|---|---|
| 4,430,582 | A * | 2/1984 | Bose et al. | 326/65 |
| 4,563,595 | A * | 1/1986 | Bose | 327/206 |
| 4,585,955 | A * | 4/1986 | Uchida | 327/541 |
| 4,868,483 | A * | 9/1989 | Tsujimoto | 323/313 |
| 5,329,184 | A * | 7/1994 | Redfern | 326/66 |
| 5,430,682 | A * | 7/1995 | Ishikawa et al. | 365/226 |
| 5,757,226 | A * | 5/1998 | Yamada et al. | 327/541 |
| 5,963,094 | A * | 10/1999 | Linder et al. | 330/264 |
| 6,229,384 | B1 * | 5/2001 | Ohsawa | 327/541 |
| 7,151,391 | B2 * | 12/2006 | Chen et al. | 326/68 |
| 7,583,107 | B2 * | 9/2009 | Pratlong et al. | 327/51 |
| 7,593,201 | B2 | 9/2009 | Ishizuka et al. | |
| 7,737,720 | B2 * | 6/2010 | Idgunji et al. | 326/33 |
| 7,924,539 | B2 | 4/2011 | Ishizuka et al. | |
| 8,432,144 | B2 * | 4/2013 | Notani | 323/280 |
| 2003/0025130 | A1 | 2/2003 | Takahashi et al. | |
| 2004/0256692 | A1 * | 12/2004 | Kunz et al. | 257/500 |
| 2005/0007174 | A1 * | 1/2005 | Kobayashi | 327/313 |
| 2005/0258864 | A1 | 11/2005 | Chen et al. | |
| 2006/0087781 | A1 | 4/2006 | Ishizuka et al. | |
| 2009/0189684 | A1 * | 7/2009 | Gouin | 327/543 |
| 2009/0273870 | A1 | 11/2009 | Ishizuka et al. | |
| 2011/0032028 | A1 * | 2/2011 | Nakashima | 327/543 |
| 2011/0080761 | A1 * | 4/2011 | Kung | 363/127 |

FOREIGN PATENT DOCUMENTS

| | | |
|---|---|---|
| CN | 101710700 A | 5/2010 |
| WO | 2012015550 A3 | 2/2012 |

* cited by examiner

*Primary Examiner* — Thomas J Hiltunen

(57) ABSTRACT

In various embodiments, a circuit is provided including a supply terminal, a logic circuit, an inverter and a control transistor which may include a body region, first and second source/drain regions, a gate insulating region having a layer thickness and a gate region. The first source/drain region may be coupled to the supply terminal. The logic circuit may have an internal supply terminal connected to the second source/drain region of the control transistor and a plurality of transistors each having a gate insulating region having a second layer thickness. The inverter input may be coupled to the internal supply terminal of the logic circuit and the output to the gate region of the control transistor. The inverter may include a transistor with a gate insulating region having a third layer thickness substantially equal to the first and second layer thicknesses.

24 Claims, 4 Drawing Sheets

VOLTAGE REGULATING CIRCUIT

TECHNICAL FIELD

Various embodiments relate to a voltage regulating circuit.

BACKGROUND

ICs (integrated circuits) with predominant digital functionality mostly include a separate power supply terminal for each voltage domain. If for example, the IC includes a digital controller, which operates at 1.5V, and further input terminals and output terminals configured to receive and output 3.3V signals, then the IC includes at least one power supply terminal for applying 1.5V (or a plurality of internally interconnected power supply terminals may be provided) and at least one further power supply terminal for applying 13V. The supply voltages are provided by external voltage regulators. Furthermore, the supply voltages may need to be buffered by capacitors which are coupled in parallel to the supply terminals. The buffering is required since the time scale on which the power consumption of the predominantly digital IC changes is orders of magnitude shorter than the time scale on which the external voltage regulator would be able to react to sudden step-like load variations and adjust the supply voltage which is provided to the load, for example represented by the IC. The power consumption of predominantly digital ICs features pulses the widths of which are on the order of 10 nanoseconds with technologies at 5V (that is, in predominantly digital ICs operating at 5V) and reaching down to 100 picoseconds with technologies at 1.5V (that is, in predominantly digital ICs operating at 1.5V). The pulse-shaped power consumption in (predominantly) digital IC is caused by their synchronous operation. However, control settling times of typical voltage regulators are on the order of approximately 1 microsecond such that they are clearly unable to react to sudden jumps in load conditions caused by the (predominantly) digital IC.

In ordinary voltage regulators usually a single transistor of a voltage domain chosen high enough such that it is designed to handle at least the highest input voltage of the voltage regulator is used as a control device. In addition, operational amplifiers may be used as regulating amplifiers or in circuits fulfilling equivalent functions which provide a high static control precision at the cost of relatively high signal delay times due to the use of multiple amplifying stages. Those two reasons may be seen as mainly responsible for the rather long control settling times of ordinary voltage regulators.

Digital circuits with low power consumption, for example for mobile applications, often include an internal voltage regulator which provides the smaller of the supply voltages such that the other (larger) supply voltage may need to be supplied externally. Those kinds of circuits, however, require the internal low supply voltages to be buffered by external capacitors. Thus, the internal feed lines have to be led to the external of the IC via additional pins, entailing all the disadvantages such as, for example, a required ESD (electrostatic discharge) protection and the necessity to provide additional pins in an integrated circuit.

In digital circuits with even lower power consumption buffer capacitors may be included internally. Examples for such architectures may be found in chip cards or RFID (radio-frequency identification) applications. In addition, circuits in those fields of application are usually not operated in synchronous operation modes in order to reduce the magnitude of the spikes in their power consumption spectrum.

With the trend towards further digitalization, more and more applications are transformed from formerly predominant analog operation mode to digital operation using complex digital circuits. In contrast to digital circuits, the power consumption in analog circuits is largely continuous. Internal low voltage domains and higher supply voltages supplied externally may be easily regulated in analog circuits by means of internal voltage regulators such that they do not have to be led to the external of the IC in order to be buffered, as described in the case of digital ICs. The user of such an analog circuit remains unaware of the internal power supply domains and is uninvolved in their operation. Digital parts of the circuit in such products/applications are mostly operated in asynchronous mode and therefore have a rather small power consumption such that they can be easily supplied with power by internal voltage regulators.

One prominent example of such applications is the field of integrated control circuits for SMPS (switched-mode power supply) which may require a relatively high external supply voltage in the range of 15V to 20V due to the high output voltage of the gate drivers. Such integrated control circuits for SMPS ordinarily maintain an internal voltage domain of 5V in order to supply analog circuit components/parts and, to some extent, digital circuit components/parts with power. The rather complex full digitalization of those applications failed so far mainly due to the requirement of buffering the internal voltage domain for the complex digital (synchronous) logic. As described above, this needs to be done externally by leading out the corresponding feed lines to the external of the IC. Besides the obvious disadvantages that at least one terminal of the IC would be occupied and therefore cannot be used for other purposes/functions, that possibly a bigger housing would have to be used and that the user is rather reluctant to deal with the additional effort involved in providing the buffering functionality, the circuit would be rendered very susceptible to EMI (electromagnetic interference), especially at low internal supply voltages of 1.5V, for example. The vulnerability to disturbances induced by EMI is caused by other surrounding external electrical lines and/or pins carrying substantially higher voltages, for example the drain voltage of the SMPS switching transistors which is usually on the order of 600V or the power mains of the SMPS onto which electrical pulses with magnitudes on the order of 4 kV are applied during EMC (electromagnetic compatibility) testing. For those reasons, the necessity of having to lead out the internal power supply electrical lines to the external of the IC (or its housing) should be avoided.

Up to now the complexity of control circuits for power electronics has been limited to a few hundreds of logic elements which may be implemented in the 5V or the 3.3V voltage domain. Those control circuits are mostly implemented using BiCMOS (bipolar complementary metal-oxide semiconductor) technology which may be used in order to provide BJTs (bipolar junction transistors) which have a gain-bandwidth product which is substantially larger than the gain-bandwidth product of the other components within the digital IC such that the load regulation on the internal power supply line supplying the internal logic in the IC may be limited to a few hundreds of millivolts. However, with the density level of digital ICs constantly rising, the supply voltage of the internal logic continues to decrease together with its accepted absolute tolerance with regard to fluctuations. At the same time, when using those technologies just described for the manufacture of ICs the implementation of the fast BJTs may be too expensive.

More complex digital control circuits (or driving circuits), for example as used in DC-DC converters, are usually subdivided into a digital controller operating with a low supply voltage and one or more separate driving circuits operating with a higher supply voltage which only contain logic arrangements of lower complexity. Control circuits for DC-DC converters typically include a multitude of terminals such that the provision of further terminals for external buffering of the internal logic supply voltage is rather unproblematic.

SUMMARY

In various embodiments, a circuit is provided, a supply terminal configured to receive a supply voltage; a control transistor which may have a body region, a first source/drain region, a second source/drain region, a gate insulating region disposed above the body region and a gate region disposed above the gate insulating region, wherein the first source/drain region may be coupled to the supply terminal and wherein the gate insulating region may have a first layer thickness; a logic circuit including an internal supply terminal and a plurality of transistors, each of the transistors having a gate insulating region of a second layer thickness, wherein the internal supply terminal may be coupled to the second source/drain region of the control transistor; an inverter including an inverter input and an inverter output, wherein the inverter input may be coupled to the internal supply terminal of the logic circuit and the inverter output may be coupled to the gate region of the control transistor, wherein the inverter may include at least one transistor with a gate insulating region having a third layer thickness; wherein the first layer thickness, the second layer thickness and the third layer thickness may be substantially equal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

According to various embodiments a circuit for regulating a voltage may be provided which may be used to provide relatively low supply voltages (in relation to the supply voltage provided to the circuit according to various embodiments), for example voltages of approximately 5V or less, for example voltages of approximately 3V or less or, for example, voltages of 1.5V or less. Those (internal) supply voltages may be supplied, for example, to complex digital circuits operating in synchronous mode without the necessity of using external decoupling capacitors.

The term decoupling capacitor refers to a capacitor coupled in parallel to a supply terminal of an IC (i.e. one side of the capacitor may be coupled to the supply terminal of the IC and the other side of the buffer capacitor may be coupled to a reference potential, for example the ground potential). The decoupling capacitor may be provided in order to serve as a charge buffer and/or voltage stabilizing component/device such that it may prevent the voltage provided to the respective terminal of an IC it is coupled to from dropping due to the usually pulse-shaped power consumption of a digital IC operating in synchronous mode. For example, decoupling capacitors may be used to stabilize supply voltages provided to an IC by providing a decoupling capacitor as close as possible to the respective supply terminal of the predominantly digital IC which is configured to receive the supply voltage. In other words, the decoupling capacitor may be configured as a local energy storage to avoid fluctuations of the supply voltage due to changing power demands of the IC, for example a predominantly digital IC, which may occur on a timescale which is too short for the power supply providing the supply voltage to react to.

According to various embodiments, a buffer capacitor may be understood to function as a decoupling capacitor. However, since the capacitance of a buffer capacitor may be smaller than the usual capacitance of decoupling capacitors due to reasons which will be described later on, the buffer capacitor may be implemented in the integrated circuit but providing the same functionality as the decoupling capacitor placed outside of the IC, for example external of the IC between a respective pin or terminal of the IC and the reference potential.

Figure 1:
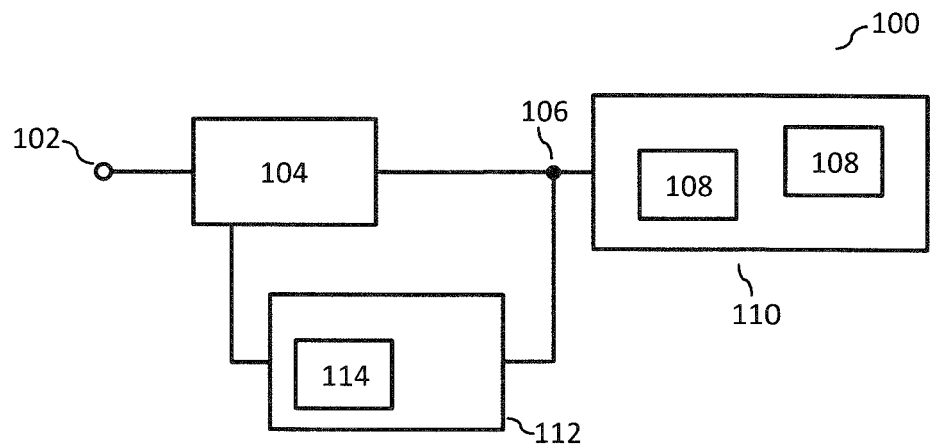
FIG. 1 shows an embodiment of the circuit.

In FIG. 1 a circuit 100 according to various embodiments is shown. The circuit 100 according to various embodiments may include a supply terminal 102 configured to receive a supply voltage. The circuit 100 according to various embodiments may further include a control transistor 104 which may have a body region, a first source/drain region, a second source/drain region, a gate insulating region disposed above the body region and a gate region disposed above the gate insulating region, wherein the first source/drain region may be coupled to the supply terminal 102 and wherein the gate insulating region may have a first layer thickness. The control transistor 104 may be configured as a MOSFET (metal-oxide-semiconductor field effect transistor), for example. The circuit 100 according to various embodiments may further include a logic circuit 110 having a internal supply terminal 106 and a plurality of transistors 108, each of the transistors 108 having a gate insulating region of a second layer thickness, wherein the internal supply terminal 106 may be coupled to the second source/drain region of the control transistor 104. In the embodiment of the circuit 100 shown in FIG. 1 only two transistors 108 within the logic circuit 100 are shown. However, the amount of transistors 108 provided in the logic circuit 110 may amount to several thousand or even more such as a few tens of millions of transistors as present in modern CPUs (central processing units) and may be in general chosen according to need. The logic circuit 110 may be a purely digital circuit or it may be a circuit including at least one analog subcircuit and at least one digital subcircuit. In general, the logic circuit 110 may be a digital subcircuit of an integrated overall system. The circuit 100 according to various embodiments may further include an inverter 112 having an inverter input and an inverter output, wherein the inverter input is coupled to the internal supply terminal 106 of the logic circuit 110 and the inverter output is coupled to the gate region of the control transistor 104, wherein the inverter comprises at least one transistor 114 with a gate insulating region having a third layer thickness. The control transistor 104, the at least one of the plurality of transistors 108 of the logic circuit 110 and the at least one transistor 114 of the inverter 112 may be configured such that the first layer thickness, the second layer thickness and the third layer thickness are substantially equal. In accordance with various embodiments of the circuit 100 the a layer thickness may be considered to be substantially equal to another layer thickness when the difference between the one layer thickness and the other layer thickness is not larger than 15% (based on the larger layer thickness, for example) and, for example, amounts to not more than 10% or, for example, amounts to not more than 5%, given that the material of all the layers is the same.

A control transistor 104 designed according to logic design rules may have a low electric strength. In accordance with various embodiments the electric strength may relate to the maximum voltage applicable between the first drain/source terminal and the second drain/source terminal of a transistor without the transistor being or having a reduced reliability. Depending on the desired stability of such a transistor with respect to hot carrier effects, the maximum rated source-to-drain voltage while conducting may be lower than the allowable supply voltage of digital circuits. For example, in the case of a technology for digital transistors in the 1.5V voltage domain (i.e. a digital circuit layout designed for signals of up to 1.5V amplitude) the output voltage at the second drain/source terminal of the control transistor 104 which is coupled to the internal supply terminal 106 of the logic circuit 110 should lie in the range of approximately 2V to 2.5V, which in that case leads to a voltage drop of approximately 0.5V to 1V across the control transistor 104.

The supply voltage may be a supply voltage generated by an external power supply and it may be larger than the supply voltage required for the operation of a digital circuit, such as the logic circuit 110. Therefore, the control transistor 104 may be configured to provide an internal supply voltage at its second source/drain terminal which may be lower than the (external) supply voltage that may be applied to the supply terminal 102 of the circuit 100 according to various embodiments. The internal supply voltage provided by the control transistor 104 may then be provided to the logic circuit 110, wherein the value of the internal supply voltage may be matched to the required value of the supply voltage required by the logic circuit 110 for proper operation. In one of very many possible configuration scenarios a supply voltage of 20V may be applied to the supply terminal 102 of the circuit 100 according to various embodiments. The internal supply voltage output by the control transistor 104, i.e. provided at the second drain/source terminal of the control transistor 104 may be 5V, or 3.3V, or 2V or 1.5V or 1.2V to name a few non-limiting examples. The internal supply voltage which corresponds to the controlled output voltage of the control transistor 104 may be also applied to the input of the inverter 112. The output of the inverter 112 may be coupled to the gate region of the control transistor 104. The circuit 100 according to various embodiments may further include a voltage follower, also referred to as unity gain buffer (not shown in FIG. 1), which may be coupled between the output of the inverter 112 and the gate region of the control transistor 104.

The positive and the negative (or the higher and the lower) supply voltage of the inverter 112 may be chosen such that the threshold voltage of the inverter 112 corresponds to the internal supply voltage to be provided to the logic circuit 110. The supply voltages provided to the inverter 112 may be for example derived from a reference inverter which may be provided with a constant current. This aspect will be described in more detail later on.

The circuit 100 according to various embodiments may use a transistor as a controlling element, wherein its essential properties/parameters such as channel length, thickness of the gate oxide, doping concentration to name a few non-limiting examples, which define its operation characteristics may be configured such that they are at least comparable, for example they may lie within a 15% deviation margin or within a 10% deviation margin or within a 5% deviation margin, or they may be substantially equal to the corresponding properties/parameters of transistors in the devices and/or circuit components to be supplied with the internal supply voltage such as the plurality of transistors 108 provided in the logic circuit 110.

Furthermore, the circuit 100 according to various embodiments may be configured such that the essential properties/parameters of the control transistor 104 such as channel length, thickness of the gate oxide, doping concentration of the channel to name a few non-limiting examples, which define its operation characteristics are at least comparable, for example may lie within a 15% deviation margin or within a 10% deviation margin or within a 5% deviation margin or may be substantially equal to the corresponding properties/parameters of the at least one transistor 114 within the inverter 112. The inverter 112 may be used as a voltage amplifier and it may include complementary transistors, e.g. an NMOSFET (n-channel MOSFET) and a PMOSFET (p-channel MOSFET) manufactured with CMOS (complementary metal-oxide-semiconductor semiconductor) technology.

The circuit 100 according to various embodiments may further include a voltage follower (not shown in FIG. 1) which may be coupled between the output of the inverter 112 and the gate region of the control transistor 104. The voltage follower may also include complementary transistors, wherein the circuit 100 according to various embodiments may be configured such that the essential properties/parameters of the at least one of the complementary transistors of the voltage follower such as channel length, thickness of the gate oxide, doping to name a few non-limiting examples, which define its operation characteristics such may be at least comparable, for example may lie within a 15% deviation margin or within a 10% deviation margin or within a 5% deviation margin or may be substantially equal to the corresponding properties/parameters of the control transistor 104. Thus, the circuit 100 according to various embodiments may be configured such that essential properties/parameters defining the operation characteristics of the control transistor 104, the plurality of transistors 108 provided in the logic circuit 110, the at least one transistor 114 within the inverter 112 and the at least one transistor of the voltage follower are at least comparable or substantially equal to one another. In other words, the operation characteristics such as switching timings, response times and electric strength of the control transistor 104, the plurality of transistors 108 provided in the logic circuit 110, the at least one transistor 114 within the inverter 112 and the at least one transistor of the voltage follower may be comparable or substantially equal to each other.

Since the properties/parameters which may define the operation characteristics of the transistors mentioned so far as being possibly provided in the circuit 100 according to various embodiments may be at least comparable to one another or substantially equal, the shortest response time or the maximum operating frequency of all the transistors used in the circuit 100 according to various embodiments may be also comparable to one another or substantially equal. In addition, similar circuit topologies are used (for example the CMOS inverter 112). For those two reasons, the response time of the voltage regulator which may be seen to be embodied by the control transistor 104 and the inverter 112 driving the control transistor 104 may be on the same order as the switching speed of the logic circuit 110 and the settling time of the voltage regulator may be less than one clock cycle of the clock defining the operation speed of the logic circuit 110. An integrated buffer capacitor (not shown in FIG. 1) which, for example, may be coupled between the second source/drain terminal of the control transistor 104 and the reference potential may be configured such (e.g. by choosing a proper capacitance value) that it only has to buffer the charges drawn by the logic circuit 110 from the point of the rising edge of the clock cycle until a response is provoked in the voltage regulator.

Figure 2:
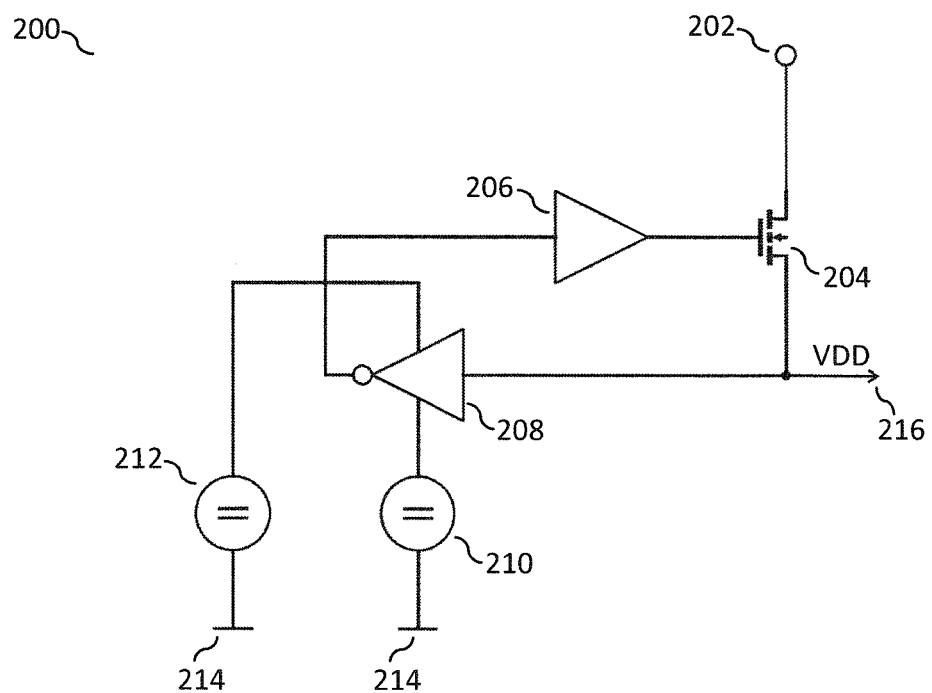
FIG. 2 shows a further embodiment of the circuit with a single control transistor.

In FIG. 2 a more detailed view of the circuit 100 according to various embodiments is shown. The circuit 200 according to various embodiments shown in FIG. 2 may include the supply terminal 202 configured to receive the (external) supply voltage. The circuit 200 according to various embodiments may further include the control transistor 204 which may have a body region, a first source/drain region, a second source/drain region, a gate insulating region disposed above the body region and a gate region disposed above the gate insulating region, wherein the first source/drain region may be coupled to the supply terminal 202 and wherein the gate insulating region may have a first layer thickness. The control transistor 204 may be configured as a MOSFET, for example. The second source/drain region of the control transistor 204 may be configured to provide a controlled output voltage which may be provided at an internal supply terminal 216. A load, for example the already mentioned logic circuit (not shown in FIG. 2), may be coupled to the internal supply terminal 216. From the point of view of the load connected to the internal supply terminal 216, the controlled output voltage of the control transistor 204 may be an internal supply voltage VDD. An input of the inverter 208 may be coupled to the internal supply terminal 216 such that the internal supply voltage VDD may be also applied to the input of the inverter 208. The internal supply voltage VDD being applied to the input of the inverter 208 may be seen as a feedback signal used by the inverter 208 to generate a respective control signal which may then be applied to the gate region of the control transistor 204. The output of the inverter 208 may be coupled to an input of a voltage follower 206 which may be configured as a unity gain amplifier. An output of the voltage follower 206 may then be coupled to the gate region of the control transistor 204. In its simplest form, the voltage follower 206 may be embodied by a capacitor.

The inverter 208 may further include a first supply input and a second supply input, wherein a first voltage source 210 may be coupled to the first supply input of the inverter 208 and a second voltage source 212 may be coupled to the second supply input of the inverter 208. Both the first voltage source 210 and the second voltage source 212 are further coupled to the reference potential 214, for example the ground potential. The first voltage source 210 and the second voltage source 212 are configured to provide supply voltages to the inverter 208, i.e. a first supply voltage (supplied to the first supply input) and a second supply voltage (provided to the second supply input). The supply voltages may be configured such that the threshold voltage of the inverter 208 is substantially equal to the desired value of the internal supply voltage VDD, i.e. the controlled output voltage output by the control transistor 204. In the case of a CMOS inverter, the inverter 208 may operate in the region where both its transistors are conducting, between the two steady-state conditions of either the one or the other transistor being in a conducting state (and at the same time the other transistor being in a non-conducting state), i.e. in the region where the transfer characteristic features a steep slope. In other words, the inverter 208 may be configured to operate in a class AB working point. For example, if the logic circuit connected to the internal supply terminal 216 requires a supply voltage of 3.3V for proper operation, then the first voltage source may provide a first supply voltage of 1.8V to the first supply input of the inverter 208 and the second voltage source may provide a second supply voltage of 4.8V to the second supply input of the inverter 208. According to a further example, if the logic circuit connected to the internal supply terminal 216 requires a supply voltage of 1.5V for proper operation, then the first voltage source may provide a first supply voltage of 0.75V to the first supply input of the inverter 208 and the second voltage source may provide a second supply voltage of 2.25V to the second supply input of the inverter 208. The relative offset of the first supply voltage and the second supply voltage from the internal supply voltage VDD may be adjusted in dependence of the sensitivity of the control transistor 204 with regard to a voltage applied to its gate region.

According to various embodiments, instead of only one control transistor multiple transistors may be arranged in series or in other words in a cascaded arrangement, wherein each additional transistor located closer to the input 202 of the circuit 200 according to various embodiments to which the (external) supply voltage is applied may belong to a higher voltage domain class compared with the transistor connected one position further away from the input of the circuit according to various embodiments.

The term voltage domain class may be understood to refer to the range of voltages which the transistor is designed for. For example, a transistor belonging to a 3.3V voltage domain class may be designed to operate with source-to-drain voltages of up to 3.3V. The voltage domain class of a respective transistor may be defined by certain characteristics thereof, for example by its channel length, thickness of the gate oxide, doping concentration to name a few non-limiting examples. At least one of those exemplarily listed parameters or an arbitrary combination of those may be adjusted in order to produce a transistor designed for operation in a certain voltage domain. For example, increasing the thickness of the gate oxide and/or increasing the channel length will usually result in a transistor which belongs to a higher voltage domain class as it then may be able to accept higher source to drain voltages without taking any damage.

The terminals between the transistors in the series arrangement of transistors (or the cascade of transistors) may be coupled to buffer capacitors. The capacitance value of a buffer capacitor provided between two transistors, wherein one transistor belongs to a higher voltage domain class and the other transistor belongs to a lower voltage domain class, may be chosen such that the buffer capacitor may only need to provide charges drawn by the faster transistor (i.e. usually the transistor from the lower voltage domain class) until the slower transistor (i.e. usually the transistor from the lower voltage domain class) has been driven into a more conducting state and is thus able to provide the required increased current.

Due to the larger voltage shift applied to the buffer capacitor its capacitance value may be substantially smaller in comparison to the capacitance value of a buffer capacitor which is coupled directly to the input terminal of a logic circuit, e.g. a digital IC, and has to provide the same amount of charges, but at a lower voltage (note that the capacitance of a capacitors scales inversely with increasing voltage shift applied to it). The control transistor 204 may be configured such that it may tolerate and regulate voltage shifts which are larger than the maximum rated voltage shifts generated/tolerable by the digital circuit. Furthermore, the gate charge required by the transistors arranged in the cascade may be provided by further capacitors. Only the gate charge of the last transistor in the cascade, i.e. the control transistor, which requires a lower gate charge compared to the other transistors and the output voltage of which is applied to the input of the logic circuit may need to be provided by means of a voltage follower.

Figure 3:
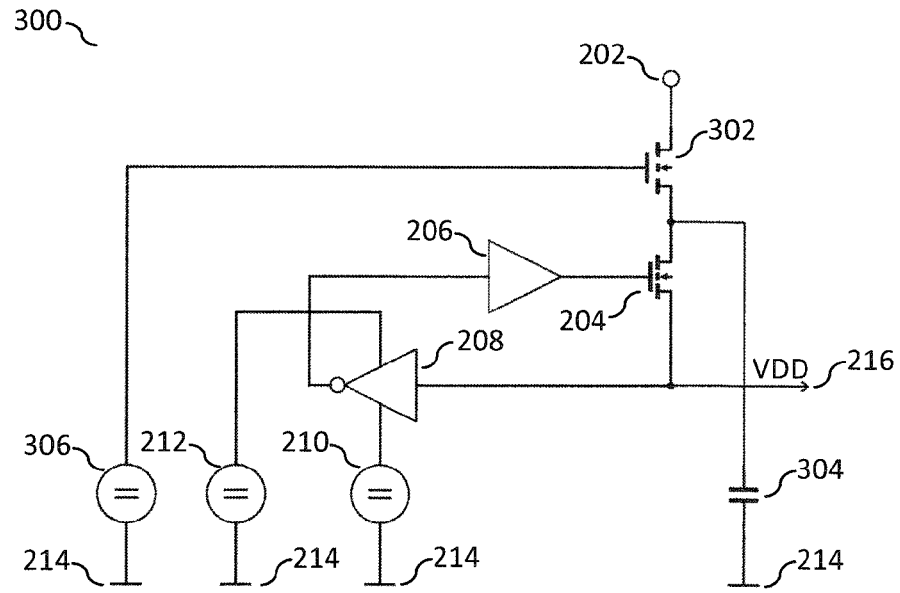
FIG. 3 shows yet a further embodiment of the circuit with a cascade of transistors.

An exemplary circuit 300 according to various embodiments with a cascade of transistors is shown in FIG. 3. As the circuit 300 according to various embodiments is based on the circuit 200 shown in FIG. 2., the same components fulfilling the same functions carry the same reference numbers and will not be described again in the context of the circuit 300 according to various embodiments shown in FIG. 3. Only new components which were not shown in FIG. 2 will be described.

In the circuit 300 according to various embodiments a further transistor 302 is provided, its first source/drain terminal being coupled to the input 202 of the circuit 300 and its second source/drain terminal being coupled to the first source/drain terminal of the control transistor 204. The further transistor 302 may be designed such that it may operate in a higher voltage domain than the control transistor 204 coupled thereto. For example, the input voltage applied to the input 202 of the circuit 300 according to various embodiments and thereby to the first source/drain terminal of the further transistor 302 may lie in the range around approximately 20V whereas the voltage applied to the first source/drain terminal of the control transistor 204 which corresponds to the voltage output at the second source/drain terminal of the further transistor 302 may be in the range around approximately 5V. The actual voltage values depend on the individual configuration of the application and the circuit 300 according to various embodiments may be configured such that the (external) supply voltage provided at the input 202 of the circuit 300 is transformed into a controlled lower internal supply voltage VDD which may be provided to a circuit coupled to the internal supply terminal 216 of the circuit 300, such as the logic circuit. The gate region of the further transistor 302 may be coupled to one terminal of a third voltage source 306, the third voltage source 306 further including a terminal which may be coupled to the reference potential 214, for example the ground potential.

In the circuit 300 according to various embodiments a buffer capacitor 304 may be provided, wherein its one side may be coupled to the node between the second source/drain terminal of the further transistor 302 and the first source/drain terminal of the control transistor 204. The buffer capacitor 304 may be dimensioned such that it is able to provide the charges drawn by the logic circuit during the delay of the increase of conductivity of the further transistor 302 in response to the increased power consumption of the logic circuit coupled to the internal supply terminal 216 of the circuit 300. In other words, the buffer capacitor may only need to store an amount of charges drawn by the logic circuit during the time it takes the further transistor 302 to increase its conductivity in order to provide a higher current to the load such as the logic circuit coupled to the internal supply terminal 216. As the voltage at the node to which one side of the buffer capacitor 304 is coupled to is higher than the internal supply voltage provided at the internal supply terminal 216 of the circuit 300 according to various embodiments, the capacitance of the buffer capacitor 304 in order to store the excess charges drawn by the logic circuit may be lower compared to the case when the buffer capacitor 304 would be coupled closer to the logic circuit, e.g. with its one side coupled to the internal supply terminal 216 and with its other side coupled to the reference potential, for example the ground potential. This is due to the fact that the same amount of charges may be stored in a capacitor with a smaller capacitance when the voltage at which that capacitor is charged is increased, $C=Q/U$).

In practice, more than two transistors may be provided in a cascade. That is, in addition to the further transistor 302 additional transistors may be coupled in a series arrangement (or in other words in a cascade) between the first source/drain terminal of the further transistor 302 and the input 202 of the circuit 300 according to various embodiments. Each following additional transistor arranged closer to the input 202 may belong to a higher voltage domain class compared with an additional transistor preceding it. Therefore, a cascade of transistors may be formed, wherein the uppermost transistor in the cascade of transistors, i.e. the transistor coupled to the input 202 of the circuit 300 according to various embodiments, may belong to the highest voltage domain class and the lowest transistor in the cascade of transistors, i.e. the transistor coupled to the internal supply terminal 216 of the circuit 300 according to various embodiments and thereby to the input of the load, for example the logic circuit (not shown in FIG. 3), may belong to the lowest voltage domain class. The transistors arranged between the uppermost transistor and the lowest transistor in the cascade may belong to voltage domain classes of gradually increasing voltages with their closer arrangement to the input 202 of the circuit 300. The voltage domain class of the lowest transistor, i.e. the control transistor 204, may correspond to the voltage domain class of the transistors provided in the logic circuit. The voltage domain class of the further transistor 302 may correspond to the voltage domain class of devices used in analog circuits within the same integrated circuit, i.e. the circuit 300 itself or a circuit into which the circuit 300 according to various embodiments may be embedded into or with which the circuit 300 according to various embodiments may be interconnected with. The voltage domain class of the further transistor 302 may be adjusted to the voltage domain class of the analog circuit by choosing the further transistor 302 to have the same geometries as the transistors in the analog circuit, so for example by choosing the same channel length or the same layer thickness of the gate insulating region. As an additional third transistor (coupled between the input 202 and the further transistor 302) a transistor may be provided the voltage domain class of which may correspond to the voltage domain class of transistors used in gate drivers within the same integrated circuit, i.e. the circuit 300 according to various embodiments or the circuit into which the circuit 300 according to various embodiments may be embedded into or with which the circuit 300 according to various embodiments may be interconnected with. The additional third transistor (not shown in FIG. 3) may be configured as a DMOS (double diffused metal-oxide-semiconductor) transistor. DMOS transistors may operate in a voltage domain which coincides with the (external) supply voltage provided at the input 202 of the circuit 300 or even allows for voltages larger than the external supply voltage. Therefore, a further additional transistor cascaded between the additional third transistor configured as a DMOS transistor and the input 202 may not be required. However, already the further transistor 302 may be configured as a DMOS transistor and the cascade of transistors may include two transistors only—the control transistor 204 and the further transistor 302. Independent of the number of transistors provided in the cascade, the gate voltage applied to the gate region of any one of the transistors in the cascade of transistors may be chosen such that none of the transistors is operated outside of its rated operation voltage range. Furthermore, the cascade of transistors may be configured such that at each transistor the source-to-drain voltage is sufficiently high as to allow every transistor in the cascade to conduct the peak currents drawn by the load, for example the logic circuit (not shown in FIG. 3).

In a cascade of transistors, such as the series arrangement including the control transistor 204 and the further transistor 302 as shown in FIG. 3, a buffer capacitor 304 may be provided at every connection node between any two transistors of the cascade. According to various embodiments of the circuit 300, the buffer capacitor(s) 304 may be dimensioned such (i.e. their capacitance chosen in a particular way) that the current drawn by the load, for example the logic circuit coupled to the internal supply terminal 216, may be filtered prior to being provided to the load. In other words, the (external) supply voltage may be filtered by at least one of the buffer capacitors coupled to the cascade of transistors. This may lead to an improved EMC (electromagnetic compatibility) of the circuit 300 according to various embodiments with regard to its behaviour as a source of EMI (electromagnetic interference).

Figure 4:
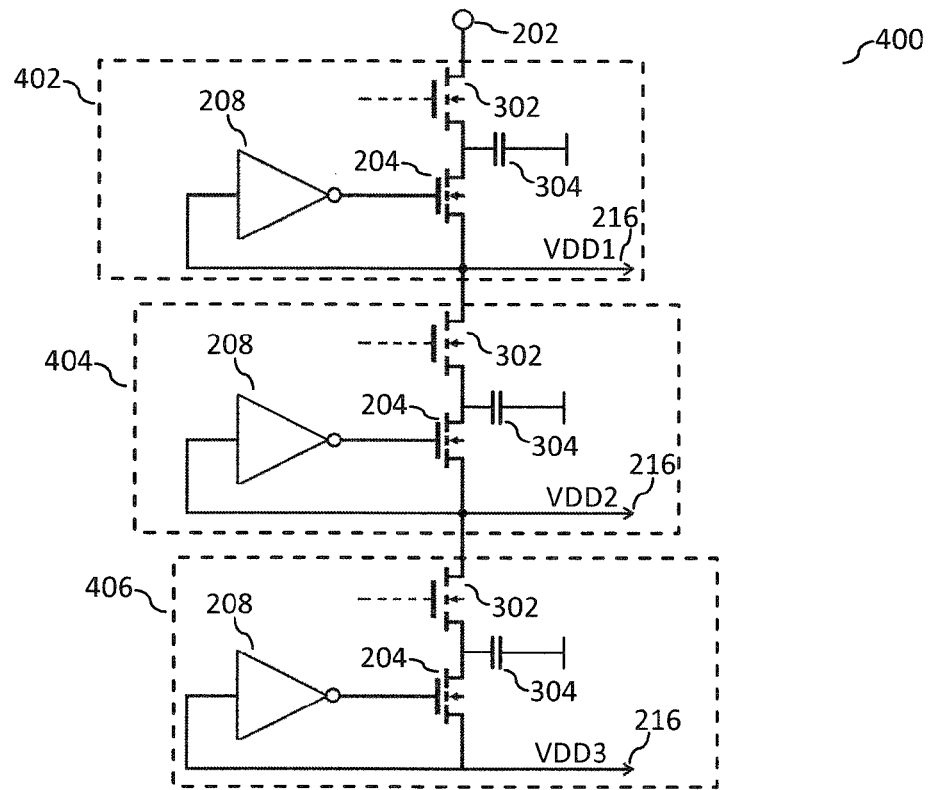
FIG. 4 shows a circuit according to various embodiments including several stages.

A further implementation of the circuit according to various embodiments is shown in FIG. 4. The circuit 400 according to various embodiments may be seen to include three cascaded stages: a first stage 402, a second stage 404 and a third stage 406. However, the circuit 400 may include a different number of cascaded stages which may be adjusted to the requirements of the respective application the circuit 400 is used with. In this exemplary embodiment of the circuit 400 each of the three stages may correspond to the circuit 300 shown in FIG. 3. However, each of the stages may be designed differently. For example, each stage may have a different number of cascaded transistors. For the sake of clarity some of the components/devices of the circuit 300 according to various embodiments FIG. 3 have been omitted in the representation of the stages in FIG. 4.

The first source/drain terminal of the further transistor 302 of the first stage 402 may be coupled to the input 202 of the circuit 400 according to various embodiments, to which the (external) supply voltage may be applied. At the output 216 of the first stage 402 a first internal supply voltage VDD1 may be provided. The output 216 of the first stage 402 may be coupled the first source/drain terminal of the further transistor 302 of the second stage 404. At the output 216 of the second stage 404 a second internal supply voltage VDD2 may be provided. The output 216 of the third stage 404 may be coupled the first source/drain terminal of the further transistor 302 of the third stage 406. At the output 216 of the third stage 406 a third internal supply voltage VDD3 may be provided. The transistors in the overall cascade, starting with the further transistor 302 in the first stage 402 and ending with the control transistor 204 in the third stage 406, may be designed to operate in gradually decreasing voltage domain classes. The further transistor 302 in the first stage 402 may belong to the highest voltage domain class of all the exemplarily shown six transistors in the cascade and the control transistor 204 in the third stage 406 may belong to the lowest voltage domain class of all the exemplarily shown six transistors in the cascade.

The circuit 400 according to various embodiments may be configured to provide the three internal supply voltages VDD1, VDD2, VDD3. The (external) supply voltage provided at the input 202 may be 20V, for example. In this exemplary scenario, the first internal supply voltage may be approximately 5V, the second internal supply voltage may be approximately 3.3V and the third internal supply voltage may be approximately 1.5V. From this example it may be seen that every stage arranged closer to the input 202 of the circuit 400 may configured to provide an internal supply voltage (for example VDD2) which is larger than the internal supply voltage provided by the following stage (for example VDD3) arranged farther away from the input 202 of the circuit 400. However, the respective values of the internal supply voltages may be different, defined in accordance with the demand of surrounding devices/components to which the supply voltages are provided.

Figure 5:
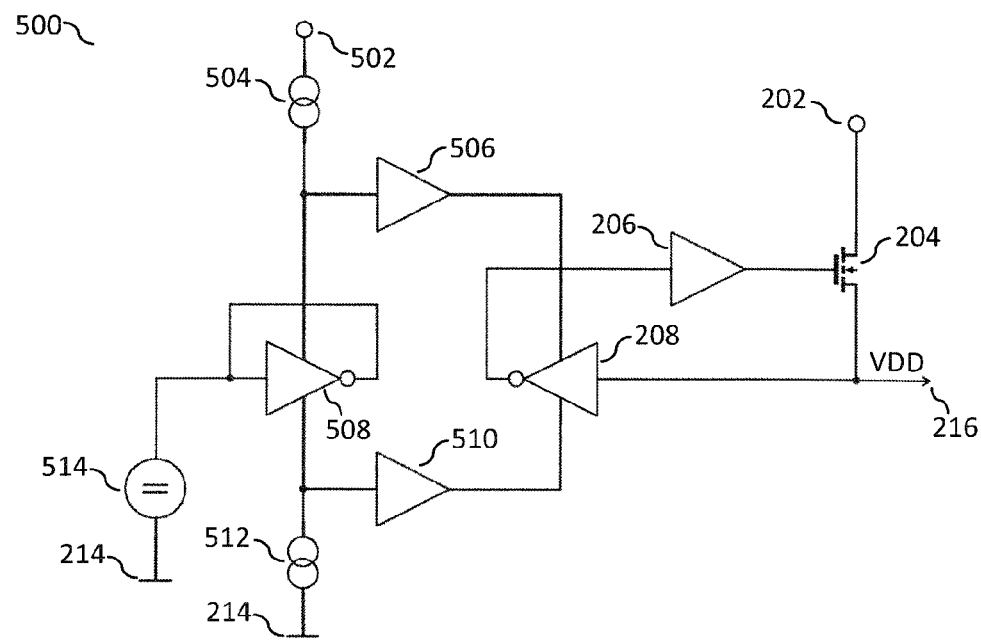
FIG. 5 shows a more detailed view of the circuit according to various embodiments from FIG. 2.

In FIG. 5 the circuit 200 according to various embodiments as shown in FIG. 2 is shown in greater detail. The circuit 500 according to various embodiments shows how the first supply voltage supplied to the first supply input of the inverter 208 and the second supply voltage supplied to the second supply input of the inverter 208 may be generated. Only the components/devices responsible for the generation of the supply voltages for the inverter 208 will be described due to the similarity of the rest of the circuit 500 according to various embodiments to the circuit 200 of FIG. 2. In the following, the inverter 208 will be referred to as the control inverter 208.

In the circuit 500 according to various embodiments a reference inverter 508 is provided, wherein an output of the reference inverter 508 is coupled to an input of the reference inverter 508 and the input of the reference inverter 508 is coupled to a reference voltage source 514 which may be configured to provide a reference voltage. The reference voltage source 514 is further coupled to the reference potential 214, for example the ground potential. Supply terminals of the reference inverter 508 are coupled to constant current sources, i.e. the first supply terminal of the reference inverter 508 may be coupled to a first constant current source 504 which is further coupled to an input 502 at which the supply voltage may be provided and the second supply terminal of the reference inverter 508 may be coupled to a second constant current source 512 which is further coupled to the reference potential 214, for example the ground potential. A constant current may be supplied to the first supply input terminal and to the second supply input terminal of the reference inverter 508 by the first constant current source 504 and the second constant current source 512, respectively. The resulting voltages at the input terminals of the reference inverter 508 may be provided to the supply input terminals of the control inverter 208 via voltage followers 506, 510 (for example configured as unity gain amplifiers). The voltage followers 506, 510 may be seen to act as voltage buffers. In order to avoid loading of the reference voltage source 514, the output of the reference inverter 508 may be coupled to the output 216 of the circuit 500 according to various embodiments instead of being coupled to the input of the reference inverter 508 (and thereby to the output of the reference voltage source 514). The internal supply voltage VDD corresponds to the reference voltage provided to the input of the reference inverter 508 once the voltage regulating part of the circuit 500 according to various embodiments has settled, i.e. when the control inverter 208, the voltage follower 206 and the control transistor 204 are in steady state.

Figure 6:
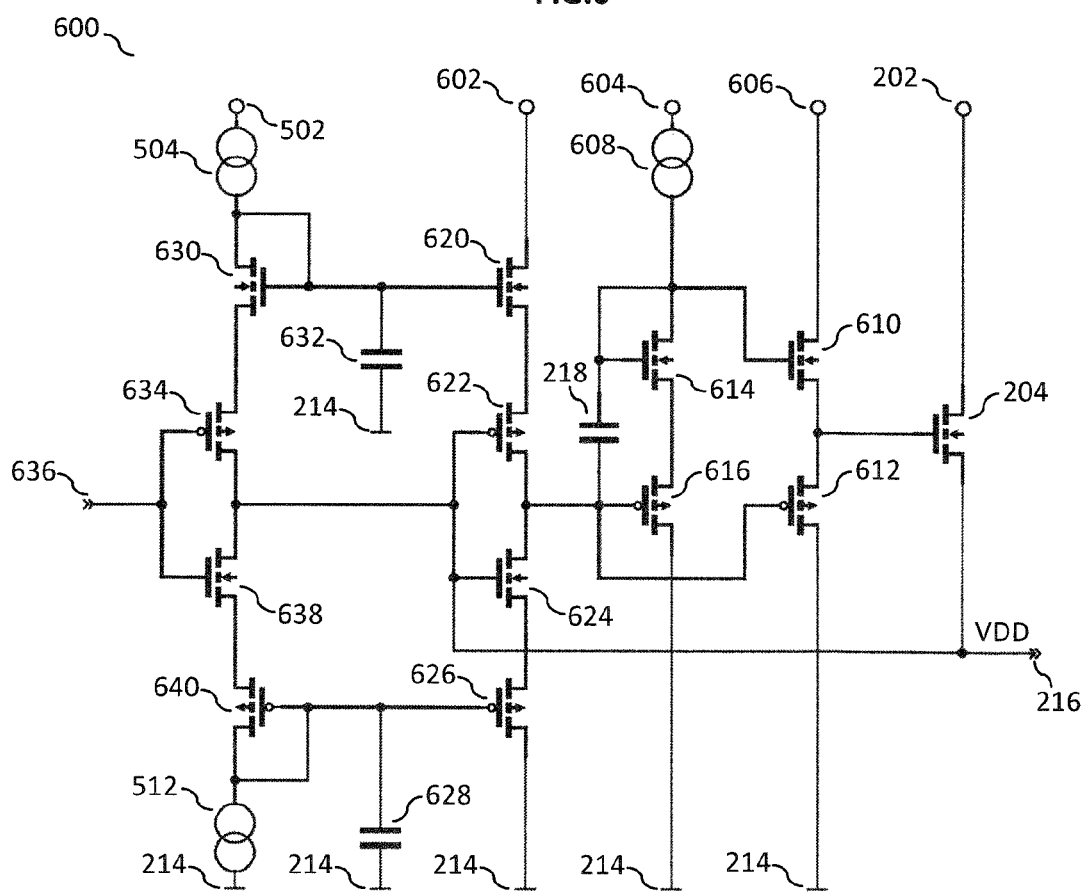
FIG. 6 shows a detailed possible implementation of the circuit according to various embodiments shown in FIG. 5.

In FIG. 6 a more detailed view of the circuit 500 shown in FIG. 5 is presented. The circuit 600 may include a first input terminal 502 to which a first input voltage may be applied, for example the supply voltage. The first input terminal 502 may be coupled to a first constant current source 504 which may be coupled to a first source/drain terminal of a first transistor 630 and to a gate region of the first transistor 630. The gate region of the first transistor is coupled to a gate region of a fifth transistor 620 and to one side of a first capacitance 632, the other side of the first capacitance 632 being coupled to the reference potential 214, e.g. the ground potential. A second source/drain terminal of the first 630 transistor may be coupled to a first source/drain terminal of a second transistor 634. A second source/drain terminal of the second transistor 634 may be coupled to a first source/drain terminal of a third transistor 638, to a gate region of an eighth transistor 622, to a gate region of a seventh transistor 624 and to the output 216 of the circuit 600. A gate region of the second transistor 634 and a gate region of the third transistor 638 may be coupled to a reference signal input 636. A second source/drain terminal of the third transistor 638 may be coupled to a first source/drain terminal of a fourth transistor 640. A second source/drain terminal of the fourth transistor 640 may be coupled to a gate region of the fourth transistor 640 and to the reference potential 214 via a second constant current source 512. The gate region of the fourth transistor 640 may be coupled to a gate region of a sixth transistor 626 and to one side of a second capacitor 628, the other side of the capacitor 628 being coupled to the reference potential 214, e.g. the ground potential. A second input terminal 602 to which a second input voltage may be applied, for example the supply voltage, may be coupled to a first source/drain terminal of the fifth transistor 620. A second source/drain terminal of the fifth transistor 620 may be coupled to the first source/drain terminal of the eighth transistor 622. A first source/drain terminal of the eighth transistor 622 may be coupled to one side of a third capacitance 218, to a gate region of a tenth transistor 616, to a gate region of a twelfth transistor 612 and to a first source/drain terminal of the seventh transistor 624. A second source/drain terminal of the seventh transistor 624 may be coupled to a first source/drain terminal of the sixth transistor 626, the second source/drain terminal of the sixth transistor 626 being coupled to the reference potential 214, e.g. the ground potential. The other side of the third capacitor 218 may be coupled to a gate region of a ninth transistor 614 and to a gate region of an eleventh transistor 610. A third input terminal 604 to which a third input voltage may be applied, for example the supply voltage, may be coupled to a first source/drain terminal of the ninth transistor 614 via a third constant current source 608. The second source/drain terminal of the ninth transistor 614 may be coupled to a first source/drain terminal of the tenth transistor 616. A second source/drain terminal of the tenth transistor 616 may be coupled to the reference potential 214, e.g. the ground potential. A fourth input terminal 606 to which a fourth input voltage may be applied, for example the supply voltage, may be coupled to a first source/drain terminal of the eleventh transistor 610. The second source/drain terminal of the eleventh transistor 610 may be coupled to a first source/drain terminal of the twelfth transistor 612 and to the gate region of the control transistor 204. A second source/drain terminal of the twelfth transistor 612 may be coupled to the reference potential 214, e.g. the ground potential.

The transistors in the circuit 600 according to various embodiments which have been labelled with an even number in the process of counting (e.g. the second transistor 634, the twelfth transistor 612) may be configured as PMOS transistors. The transistors in the circuit 600 according to various embodiments which have been labelled with an uneven number in the process of counting (e.g. the first transistor 630, the eleventh transistor 610) may be configured as NMOS transistors.

In the circuit 600 according to various embodiments the voltage follower (element 206 in FIG. 5) includes complementary CMOS transistors (the ninth transistor 614, the tenth transistor 616, the eleventh transistor 610 and the twelfth transistor 612) and it may be configured to operate at a class AB working point. The gate regions of the tenth transistor 616 and the twelfth transistor 612 are directly coupled to the output of the control inverter 208 (embodied by the eighth transistor 622 and the seventh transistor 624). In contrast thereto, the gate regions of the ninth transistor 614 and the eleventh transistor 610 are coupled to the output of the control inverter 208 via the third capacitor 218. The coupling via the third capacitor 218 introduces a DC offset between the voltage applied to the gate regions of the tenth transistor 616 and the twelfth transistor 612 and the voltage applied to the gate regions of the ninth transistor 614 and the eleventh transistor 610. This DC offset compensates the voltage difference between the potential provided at the output of the control inverter 208 (i.e. the potential between the second source/drain terminal of the eighth transistor 622 and the first source/drain terminal of the seventh transistor 624) and the potential applied to the gate region of the control transistor 204. The potential provided at the output of the control inverter 208 may correspond to the internal supply potential VDD provided at the output 216. The potential applied to the gate region of the control transistor 204 is increased by the value of the threshold voltage of the control transistor 204. The control inverter may also operate at a class AB working point. Thus, since both the control inverter and the voltage follower may operate at a class AB working point, the circuit 600 according to various embodiments may combine a low quiescent current consumption with a fast response to sudden step-like variation of the load. It may be beneficial for the control inverter 208 to operate at a class AB working point for the following reason. The currents of the first constant current source 504 and the second constant current source 512 (see FIG. 5) are chosen so low and the channel width of the second transistor 634 and the channel width of the third transistor 638 are chosen so large that the positive (or larger) supply voltage provided to the control inverter 208 may be larger from the reference voltage only by a value equal to the threshold voltage and that the negative (or smaller) supply voltage provided to the control inverter 208 may be smaller than the reference voltage only by a value equal to the threshold voltage. Here, the threshold voltage refers to the threshold voltage of the transistors used in the control inverter 208, wherein those threshold voltages may be the same as the threshold voltages of the other transistors shown in FIG. 6. The positive (or larger) supply voltage provided to the control inverter 208 may be the second supply voltage applied to the second supply input of the control inverter 208 via the second voltage follower 506. The negative (or smaller) supply voltage provided to the control inverter 208 may be the first supply voltage applied to the first supply input of the control inverter 208 via the first voltage follower 510. In case of a threshold voltage of 400 mV, the positive supply voltage may be approximately 1.9V and the negative supply voltage may be approximately 1.1V. Therefore, in steady state of control inverter 208, a very low current may flow therethrough.

Figure 7:
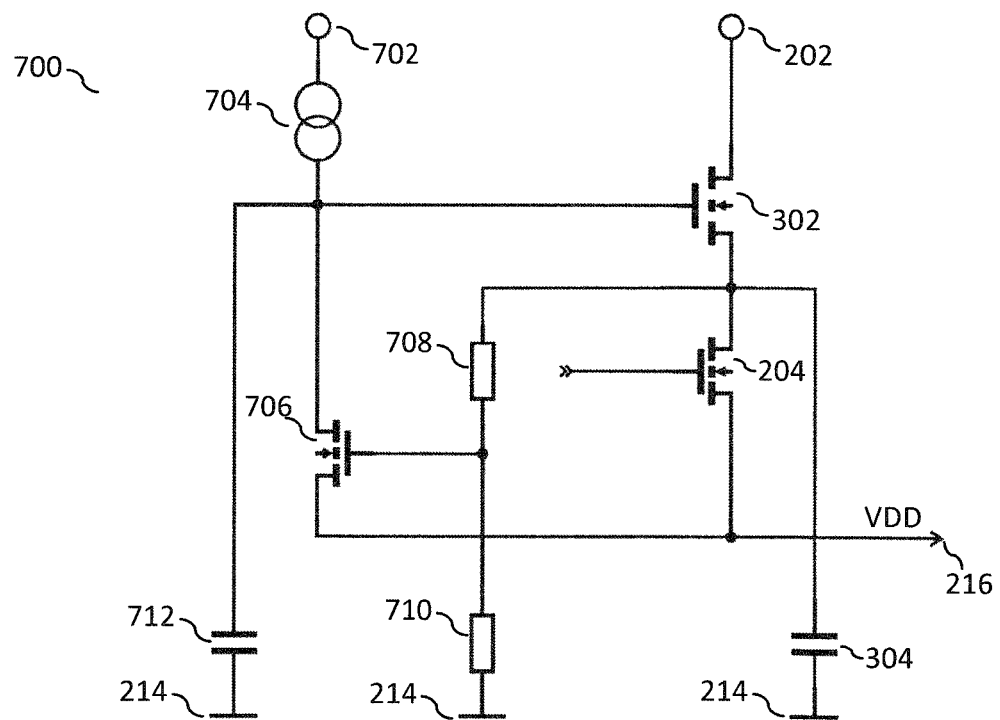
FIG. 7 shows a further embodiment of the circuit according to various embodiments.

A further implementation of the circuit according to various embodiments is shown in FIG. 7. The circuit 700 of FIG. 7 illustrates a possible setup for the provision of a gate voltage which may be applied to a gate region of a transistor in a cascade of transistors, for example of a further transistor 302. As the circuit 700 shown in FIG. 7 is based on the circuit 300 according to various embodiments shown in FIG. 3, the same reference numbers have been chosen for the same device/components fulfilling the same functions which will not be described again in detail in the context of the circuit 700 shown in FIG. 7.

The circuit 700 according to various embodiments includes the supply terminal 202 which may be coupled to the first source/drain terminal of the further transistor 302. The second source/drain terminal of the further transistor 302 may be coupled to the first source/drain terminal of the control transistor 204 and to one side of a buffer capacitor 304. The other side of the buffer capacitor 304 may be coupled to the reference potential 214, e.g. the ground potential. The second source/drain terminal of the control transistor 204 may be coupled to the internal voltage supply terminal 216 to which a load (not shown in FIG. 7) may be coupled, for example a logic circuit. The voltage applied to the gate region of the control transistor 204 may be provided in the way as illustrated in FIG. 3, for example. Therefore, electronic components providing that voltage have been omitted in FIG. 7 for the sake of clarity. The gate region of the further transistor 302 may be coupled to a constant current source 704, to a first source/drain terminal of a transistor 706 and to the reference potential 214, for example the ground potential, via a capacitance 712. The constant current source 704 may be further coupled to an input 702 of the circuit 700 according to various embodiments. A second source/drain terminal of the transistor 706 may be coupled to the second source/drain terminal of the control transistor 204 which corresponds to the output 216 of the circuit 700 according to various embodiments. A gate region of the transistor 706 may be coupled to the electrical path between the second source/drain terminal of the further transistor 302 via a first resistor 708 and to the reference potential 214, e.g. the ground potential, via a second resistor 710.

In analogy to the circuit 400 according to various embodiments shown in FIG. 4, the circuit 700 shown in FIG. 7 may be also provided in a stacked structure, i.e. it may form the basis for a single state of a circuit according to various embodiments including multiple stages.

The value of the source-to-drain voltage across the control transistor 204 may be adjusted by a suitable choice of the values for the first resistor 708 and the second resistor 710 acting as a voltage divider for the voltage applied to the gate region of the transistor 706 which in turn drives the further transistor 302. In addition, the value of the source-to-drain voltage across the control transistor 204 may depend on the threshold voltage of the control transistor 204. The capacitor 712 coupled between the gate region of the further capacitor 302 and the reference potential 214 may act as a buffer providing charges to the gate region of the further transistor 302 in the event of a sudden step-like increase of the load such as the logic circuit drawing a higher current.

The various embodiments of the circuit for providing a controlled voltage as an internal supply voltage for a load, for example for a (predominantly) digital circuit, may rely on the concept of providing a control transistor with characteristic parameters such as channel length, thickness of the gate oxide, doping concentration which may specify the voltage domain class of the control transistor chosen such that they match the corresponding characteristic parameters of transistors used in the logic circuit. In other words, the voltage domain class of the control transistor and the voltage domain class of the transistors provided in the logic circuit may be substantially equal. The circuit according to various embodiments may further include an inverter and optionally a voltage follower which may both include CMOS transistors designed such that their characteristic parameters which may specify their voltage domain class may be also substantially equal to the corresponding characteristic parameters of transistors used in the logic circuit. In addition, the circuit according to various embodiments may further include at least one further transistor coupled in series with the control transistor, wherein the voltage domain class of the further transistor may be higher than the voltage domain class of the control transistor. Therefore, the further transistor may differ in certain characteristic parameters such as channel length, thickness of the gate oxide, doping concentration from the other transistors, i.e. the control transistor, the CMOS transistors of the inverter and the voltage follower and the transistors provided in the logic circuit, for example, by having a thicker gate oxide layer or having a longer channel. The further transistor may have a gate oxide layer which is for example 2 to 5 times thicker than the gate oxide layer of the control transistor, provided that the same gate oxide material is used. The further transistor may be configured as a DMOS transistor, for example. In general, the higher the voltage domain class of a transistor, the slower the transistor may be with regard to its response to sudden changes in operating parameters, such as source-to-drain current/voltage and/or gate voltage.

In accordance with various embodiments a circuit is provided, the circuit including a supply terminal configured to receive a supply voltage; a control transistor which may have a body region, a first source/drain region, a second source/drain region, a gate insulating region disposed above the body region and a gate region disposed above the gate insulating region, wherein the first source/drain region may be coupled to the supply terminal and wherein the gate insulating region may have a first layer thickness; a logic circuit including an internal supply terminal and a plurality of transistors, each of the transistors having a gate insulating region of a second layer thickness, wherein the internal supply terminal may be coupled to the second source/drain region of the control transistor; an inverter including an inverter input and an inverter output, wherein the inverter input may be coupled to the internal supply terminal of the logic circuit and the inverter output may be coupled to the gate region of the control transistor, wherein the inverter may include at least one transistor with a gate insulating region having a third layer thickness; wherein the first layer thickness, the second layer thickness and the third layer thickness may be substantially equal.

According to various further embodiments of the circuit the control transistor may be configured to provide an internal supply voltage to the internal supply terminal of the logic circuit.

According to various further embodiments of the circuit the gate insulating region of the control transistor disposed above the body region thereof may have a first length, the gate insulating region of the at least one of the plurality of transistors comprised by the logic circuit disposed above the body region thereof may have a second length, the gate insulating region of the at least one transistor of the inverter disposed above the body region thereof may have a third length, wherein the first length, the second length and the third length may be substantially equal.

According to various further embodiments of the circuit the logic circuit may include a circuit configured to operate in synchronous mode.

According to various further embodiments of the circuit the logic circuit may include a digital circuit configured to operate in synchronous mode.

According to various further embodiments of the circuit the inverter may be configured to operate as a class AB amplifier.

According to various further embodiments of the circuit the first transistor, the at least one of the plurality of transistors comprised by the logic circuit and the at least one transistor of the inverter may be configured such that their switching characteristics are substantially equal.

According to various further embodiments of the circuit the inverter may be configured such that its threshold voltage may be substantially equal to the desired value of a voltage provided at the internal supply terminal of the logic circuit.

According to various further embodiments of the circuit the inverter may include a first transistor and a second transistor coupled in series; and wherein the inverter may be configured to operate in a mode in which the two transistors are conducting.

According to various further embodiments the circuit may further include a further transistor which may have a body region, a first source/drain region, a second source/drain region, a gate insulating region disposed above the body region and a gate region disposed above the gate insulating region, wherein the first source/drain region may be coupled to the supply terminal, the second source/drain region may be coupled to the first source/drain region of the control transistor and wherein the gate insulating region may have a fourth layer thickness.

According to various further embodiments of the circuit the fourth layer thickness may be different from any one of the first layer thickness, the second layer thickness and the third layer thickness.

In accordance with various embodiments a circuit is provided, the circuit including a supply terminal configured to receive a supply voltage; a first transistor which may have a body region, a first source/drain region, a second source/drain region, a gate insulating region disposed above the body region and a gate region disposed above the gate insulating region, wherein the first source/drain region may be coupled to the supply terminal and wherein the gate insulating region may have a first layer thickness; a second transistor which may have a body region, a first source/drain region, a second source/drain region, a gate insulating region disposed above the body region and a gate region disposed above the gate insulating region, wherein the first source/drain region of the second transistor may be coupled to the second source/drain region of the first transistor and wherein the gate insulating region may have a second layer thickness; a logic circuit including an supply terminal and a plurality of transistors, each of the transistors having a gate insulating region of a third layer thickness, wherein the supply terminal may be coupled to the second source/drain region of the second transistor, wherein the second thickness and the third thickness may be substantially equal and the first thickness is different therefrom.

According to various further embodiments of the circuit the first thickness may be larger than each of the second thickness and the third thickness.

According to various further embodiments of the circuit the second transistor may be configured to provide an internal supply voltage to the internal supply terminal of the logic circuit.

According to various further embodiments of the circuit the gate insulating region of the first transistor disposed above the body region thereof may have a first length, wherein the gate insulating region of the second transistor disposed above the body region thereof may be a second length; wherein the gate insulating region of the at least one of the plurality of transistors comprised by the logic circuit disposed above the body region thereof may have a third length, and wherein the second length and the third length may be substantially equal and the first length is different therefrom.

According to various further embodiments of the circuit the first length may be larger than each of the second length and the third length.

According to various further embodiments of the circuit the logic circuit may include a circuit configured to operate in synchronous mode.

According to various further embodiments of the circuit the logic circuit may include a digital circuit configured to operate in synchronous mode.

According to various further embodiments of the circuit the second transistor and at least one of the plurality of transistors comprised by the logic circuit may be configured such that their switching characteristics are substantially equal.

According to various further embodiments of the circuit the first transistor may be configured such that its switching behaviour is slower than the switching behaviour of the second transistor and of at least one of the plurality of transistors comprised by the logic.

According to various further embodiments of the circuit the first transistor may be configured as a double diffused MOS transistor.

According to various further embodiments the circuit may further include a capacitor with a first terminal and a second terminal, wherein the first terminal may be coupled between the first transistor and the second transistor and the second terminal may be coupled to a reference potential.

According to various further embodiments the circuit may further include an inverter including an inverter input and an inverter output, wherein the inverter input may be coupled to the supply input of the logic circuit and the inverter output may be coupled to the gate region of the second transistor, wherein the inverter may include at least one transistor with a gate insulating region having a fourth layer thickness.

According to various further embodiments of the circuit the fourth thickness may be substantially equal to the second thickness and the third thickness.

According to various further embodiments of the circuit the second transistor and the inverter may be configured to operate with a class AB characteristic.

According to various further embodiments of the circuit the inverter may be configured such that its threshold voltage may be substantially equal to the desired value of a voltage provided at the internal supply terminal of the logic circuit.

According to various further embodiments of the circuit the inverter may include a first transistor and a second transistor coupled in series; and wherein the inverter may be configured to operate in a mode in which the two transistors are conducting.

In accordance with various embodiments a circuit is provided, the circuit including a supply terminal configured to receive a supply voltage; an output terminal configured to provide an output voltage; a control transistor which may have a first source/drain region, a second source/drain region and a gate region, wherein the first source/drain region may be coupled to the supply terminal and wherein the second source/drain region may be coupled to the output terminal; an inverter including an input and an output, wherein the input may be coupled to the second source/drain region of the control transistor and the output may be coupled to the gate region of the control transistor, wherein the inverter further may include a first transistor which may be coupled between a first voltage potential and the output of the inverter and a second transistor which may be coupled between a second voltage potential and the output of the inverter.

According to various further embodiments of the circuit the inverter may be configured to receive the first voltage potential, wherein the first voltage potential may be larger than the voltage provided at the output terminal of the circuit.

According to various further embodiments of the circuit the inverter may be configured to receive the second voltage potential, wherein the second voltage potential may be smaller than the voltage provided at the output terminal of the circuit.

According to various further embodiments of the circuit the inverter may be configured such that its threshold voltage is substantially equal to the desired output voltage.

According to various further embodiments the circuit may further include a reference voltage source configured to provide a reference voltage; a reference inverter including an input, wherein the input of the reference inverter may be coupled to the reference voltage source and wherein the reference inverter may be configured to provide a third voltage potential and a fourth voltage potential; a first voltage buffer coupled to the reference inverter and configured to provide the first voltage potential from the third voltage potential; and a second voltage buffer coupled to the reference inverter and configured to provide the second voltage potential from the fourth voltage potential.

According to various further embodiments of the circuit the inverter may be configured to operate as a class AB amplifier.

According to various further embodiments the circuit may further include a voltage follower including an input and an output, wherein the input may be coupled to the inverter output and the output may be coupled to the gate region of the control transistor, wherein the voltage follower may be configured to provide a voltage at its output which may be offset from its input voltage, the offset being substantially equal to a threshold voltage of control transistor.

In accordance with various embodiments a method for providing a circuit is provided, the circuit including a supply terminal configured to receive a supply voltage; a control transistor which may have a body region, a first source/drain region, a second source/drain region, a gate insulating region disposed above the body region and a gate region disposed above the gate insulating region, wherein the first source/drain region may be coupled to the supply input and wherein the gate insulating region may have a first layer thickness; a logic circuit including a supply input and a plurality of transistors, each of the transistors having a gate insulating region of a second layer thickness, wherein the supply input may be coupled to the second source/drain region of the control transistor; an inverter including an inverter input and an inverter output, wherein the inverter input may be coupled to the supply input of the logic circuit and the inverter output may be coupled to the gate region of the control transistor, wherein the inverter may include at least one transistor with a gate insulating region having a third layer thickness; wherein the first layer thickness, the second layer thickness and the third layer thickness may be substantially equal, wherein the gate insulating region of the control transistor, the gate insulating region of the at least one of the plurality of transistors comprised by the logic circuit and the gate insulating region of the at least one transistor of the inverter are provided in the same manufacturing step.

According to various further embodiments of the method the gate insulating region of the control transistor, the gate insulating region of the at least one of the plurality of transistors included in the logic circuit and the gate insulating region of the at least one transistor of the inverter may include the same material.

According to various further embodiments of the method a further transistor coupled in series to the control transistor may be provided, the further transistor including a body region, a first source/drain region, a second source/drain region, a gate insulating region disposed above the body region and a gate region disposed above the gate insulating region, wherein one of the source/drain regions and/or gate region of the further transistor may be manufactured in a separate manufacturing step.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit comprising:
  a supply terminal configured to receive a supply voltage;
  a control transistor which has a body region, a first source/drain region, a second source/drain region, a gate insulating region disposed above the body region and a gate region disposed above the gate insulating region, wherein the first source/drain region is coupled to the supply terminal and wherein the gate insulating region has a first layer thickness;
  a logic circuit comprising an internal supply terminal and a plurality of transistors, each of the transistors having a gate insulating region of a second layer thickness, wherein the internal supply terminal is coupled to the second source/drain region of the control transistor;
  an inverter comprising an inverter input and an inverter output, wherein the inverter input is coupled to the internal supply terminal of the logic circuit and the inverter output is coupled to the gate region of the control transistor, wherein the inverter comprises at least one transistor with a gate insulating region having a third layer thickness;
  wherein the first layer thickness, the second layer thickness and the third layer thickness are substantially equal.

2. The circuit of claim 1,
  wherein the control transistor is configured to provide an internal supply voltage to the internal supply terminal of the logic circuit.

3. The circuit of claim 1,
  wherein the gate insulating region of the control transistor disposed above the body region thereof has a first length,
  wherein the gate insulating region of the at least one of the plurality of transistors comprised by the logic circuit disposed above the body region thereof has a second length;
  wherein the gate insulating region of the at least one transistor of the inverter disposed above the body region thereof has a third length, and
  wherein the first length, the second length and the third length are substantially equal.

4. The circuit of claim 1,
  wherein the first transistor, the at least one of the plurality of transistors comprised by the logic circuit and the at least one transistor of the inverter are configured such that their switching characteristics are substantially equal.

5. The circuit of claim 1, further comprising:
a further transistor which has a body region, a first source/drain region, a second source/drain region, a gate insulating region disposed above the body region and a gate region disposed above the gate insulating region, wherein the first source/drain region is coupled to the supply terminal, the second source/drain region is coupled to the first source/drain region of the control transistor and wherein the gate insulating region has a fourth layer thickness.

6. The circuit of claim 1,
wherein the inverter is configured such that its threshold voltage is substantially equal to the desired value of a voltage provided at the internal supply terminal of the logic circuit.

7. The circuit of claim 1,
wherein the inverter comprises a first transistor and a second transistor coupled in series; and
wherein the inverter is configured to operate in a mode in which the two transistors are conducting.

8. A circuit comprising:
a supply terminal configured to receive a supply voltage;
a first transistor which has a body region, a first source/drain region, a second source/drain region, a gate insulating region disposed above the body region and a gate region disposed above the gate insulating region, wherein the first source/drain region is coupled to the supply terminal and wherein the gate insulating region has a first layer thickness;
a second transistor which has a body region, a first source/drain region, a second source/drain region, a gate insulating region disposed above the body region and a gate region disposed above the gate insulating region, wherein the first source/drain region of the second transistor is coupled to the supply terminal via the second source/drain region of the first transistor and wherein the gate insulating region has a second layer thickness;
a logic circuit comprising a supply input and a plurality of transistors, each of the transistors having a gate insulating region of a third layer thickness, wherein the supply input is coupled to the second source/drain region of the second transistor; and
an inverter comprising an inverter input and an inverter output, wherein the inverter input is coupled to the supply input of the logic circuit and the inverter output is coupled to the gate region of the second transistor, wherein the inverter comprises at least one transistor with a gate insulating region having a fourth layer thickness.
wherein the second thickness and the third thickness are substantially equal and the first thickness is different therefrom.

9. The circuit of claim 8,
wherein the first thickness is larger than each of the second thickness and the third thickness.

10. The circuit of claim 8,
wherein the second transistor is configured to provide an internal supply voltage to the internal supply terminal of the logic circuit.

11. The circuit of claim 8,
wherein the gate insulating region of the first transistor disposed above the body region thereof has a first length;
wherein the gate insulating region of the second transistor disposed above the body region thereof has a second length;
wherein the gate insulating region of the at least one of the plurality of transistors comprised by the logic circuit disposed above the body region thereof has a third length, and
wherein the second length and the third length are substantially equal and the first length is different therefrom.

12. The circuit of claim 11,
wherein the first length is larger than each of the second length and the third length.

13. The circuit of claim 8,
wherein the second transistor and at least one of the plurality of transistors comprised by the logic circuit are configured such that their switching characteristics are substantially equal.

14. The circuit of claim 8,
wherein the first transistor is configured such that its switching behaviour is slower than the switching behaviour of the second transistor and of at least one of the plurality of transistors comprised by the logic.

15. The circuit of claim 8,
wherein the inverter is configured such that its threshold voltage is substantially equal to the desired value of a voltage provided at the internal supply terminal of the logic circuit.

16. The circuit of claim 8,
wherein the inverter comprises a first transistor and a second transistor coupled in series; and
wherein the inverter is configured to operate in a mode in which the two transistors are conducting.

17. A circuit comprising:
a supply terminal configured to receive a supply voltage;
a first transistor which has a body region, a first source/drain region, a second source/drain region, a gate insulating region disposed above the body region and a gate region disposed above the gate insulating region, wherein the first source/drain region is coupled to the supply terminal and wherein the gate insulating region has a first layer thickness;
a second transistor which has a body region, a first source/drain region, a second source/drain region, a gate insulating region disposed above the body region and a gate region disposed above the gate insulating region, wherein the first source/drain region of the second transistor is coupled to the supply terminal via the second source/drain region of the first transistor and wherein the gate insulating region has a second layer thickness;
a logic circuit comprising a supply input and a plurality of transistors, each of the transistors having a gate insulating region of a third layer thickness, wherein the supply input is coupled to the second source/drain region of the second transistor;
a capacitor with a first terminal and a second terminal, wherein the first terminal is coupled between the first transistor and the second transistor and the second terminal is coupled to a reference potential; and
wherein the second thickness and the third thickness are substantially equal and the first thickness is different therefrom.

18. A circuit comprising:
a supply terminal configured to receive a supply voltage;
an output terminal configured to provide an output voltage;
a control transistor which has a first source/drain region, a second source/drain region and a gate region, wherein the first source/drain region is coupled to the supply terminal and wherein the second source/drain region is coupled to the output terminal;

an inverter comprising an input and an output, wherein the input is coupled to the second source/drain region of the control transistor and the output is coupled to the gate region of the control transistor;

wherein the inverter further comprises a first transistor which is coupled between a first voltage potential and the output of the inverter and a second transistor which is coupled between a second voltage potential and the output of the inverter and wherein the inverter is configured to operate as a class AB amplifier.

19. The circuit of claim 18, wherein the inverter is configured such that its threshold voltage is substantially equal to the desired output voltage.

20. The circuit of claim 18, further comprising:

a reference voltage source configured to provide a reference voltage;

a reference inverter comprising an input, wherein the input of the reference inverter is coupled to the reference voltage source and wherein the reference inverter is configured to provide a third voltage potential and a fourth voltage potential;

a first voltage buffer coupled to the reference inverter and configured to provide the first voltage potential from the third voltage potential; and a second voltage buffer coupled to the reference inverter and configured to provide the second voltage potential from the fourth voltage potential.

21. The circuit of claim 18, further comprising:

a voltage follower comprising an input and an output, wherein the input is coupled to the inverter output and the output is coupled to the gate region of the control transistor, wherein the voltage follower is configured to provide a voltage at its output which is offset from its input voltage, the offset being substantially equal to a threshold voltage of control transistor.

22. A method for providing a circuit, the circuit comprising:

a supply terminal configured to receive a supply voltage;

a control transistor which has a body region, a first source/drain region, a second source/drain region, a gate insulating region disposed above the body region and a gate region disposed above the gate insulating region, wherein the first source/drain region is coupled to the supply terminal and wherein the gate insulating region has a first layer thickness;

a logic circuit comprising a supply input and a plurality of transistors, each of the transistors having a gate insulating region of a second layer thickness, wherein the input is coupled to the second source/drain region of the control transistor;

an inverter comprising an inverter input and an inverter output, wherein the inverter input is coupled to the supply input of the logic circuit and the inverter output is coupled to the gate region of the control transistor, wherein the inverter comprises at least one transistor with a gate insulating region having a third layer thickness;

wherein the first layer thickness, the second layer thickness and the third layer thickness are substantially equal;

wherein the gate insulating region of the control transistor, the gate insulating region of the at least one of the plurality of transistors comprised by the logic circuit and the gate insulating region of the at least one transistor of the inverter are provided in the same manufacturing step.

23. The method of claim 22, wherein the gate insulating region of the control transistor, the gate insulating region of the at least one of the plurality of transistors comprised by the logic circuit and the gate insulating region of the at least one transistor of the inverter comprise the same material.

24. The method of claim 22, providing a further transistor coupled in series to the control transistor, the further transistor comprising a body region, a first source/drain region, a second source/drain region, a gate insulating region disposed above the body region and a gate region disposed above the gate insulating region, wherein one of the source/drain regions and/or gate region of the further transistor is manufactured in a separate manufacturing step.

* * * * *